(12) United States Patent
Wang et al.

(10) Patent No.: US 10,859,625 B2
(45) Date of Patent: Dec. 8, 2020

(54) WAFER PROBE CARD INTEGRATED WITH A LIGHT SOURCE FACING A DEVICE UNDER TEST SIDE AND METHOD OF MANUFACTURING

(71) Applicant: GLOBALFOUNDRIES Singapore Pte. Ltd., Singapore (SG)

(72) Inventors: Lanxiang Wang, Singapore (SG); Meng Yew Seah, Singapore (SG); Shyue Seng Tan, Singapore (SG); Jeffrey Chor-Keung Lam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 161 days.

(21) Appl. No.: 16/107,483

(22) Filed: Aug. 21, 2018

(65) Prior Publication Data

US 2020/0064397 A1    Feb. 27, 2020

(51) Int. Cl.
*G01R 31/28* (2006.01)
*G01R 1/073* (2006.01)
*G01R 31/319* (2006.01)

(52) U.S. Cl.
CPC ..... *G01R 31/2887* (2013.01); *G01R 1/07342* (2013.01); *G01R 31/2889* (2013.01); *G01R 31/31908* (2013.01)

(58) Field of Classification Search
CPC .. G01R 31/311; G01R 31/27; G01R 31/2886; G01R 31/2889; G01R 31/303; G01R 31/31728; G01R 31/318511; G01R 31/3025; G01R 1/07342; G01R 31/28; G01R 31/2832; G01R 31/318505; G01R 33/60; G01R 31/2635; G01R 31/2855; G01R 31/2856; G01R 31/31905; G01R 31/31908; G01R 31/2887; G01N 21/6489; G01N 21/63; G01N 21/88; G01N 21/9501; G02B 6/00; G02F 2001/136254; H01L 22/14; H01L 22/34; H01L 27/14623; H01L 27/1465; H01L 31/02325; G11C 29/006
See application file for complete search history.

(56) References Cited

U.S. PATENT DOCUMENTS

| 4,902,967 A | 2/1990 | Flesner |
| 5,323,107 A * | 6/1994 | D'Souza ........ G01R 31/318533 324/750.3 |
| 7,355,423 B2 | 4/2008 | Gore et al. |

(Continued)

FOREIGN PATENT DOCUMENTS

| TW | 200725794 A | 7/2007 |
| TW | 201418737 A | 5/2014 |

(Continued)

OTHER PUBLICATIONS

Dayanand et. al., "Defect localization enhancement using light induced CI-AFP", published in the Physical and Failure Analysis of Integrated Circuits (IPFA), 2014, IEEE 21st International Symposium, pp. 375-378.

*Primary Examiner* — Vinh P Nguyen
(74) *Attorney, Agent, or Firm* — Ditthavong & Steiner, P.C.

(57) ABSTRACT

An integrated wafer probe card with a light source facing a device under test (DUT) side and enabling methodology are provided.

18 Claims, 3 Drawing Sheets

(56) References Cited

U.S. PATENT DOCUMENTS

| | | | | |
|---|---|---|---|---|
| 7,459,921 B2* | 12/2008 | Mayder | ............ | G01R 31/2889 |
| | | | | 324/756.03 |
| 7,538,564 B2* | 5/2009 | Ehrmann | ........... | G01R 31/2891 |
| | | | | 324/754.03 |
| 7,589,541 B2* | 9/2009 | Yamasaki | ................. | G01J 3/10 |
| | | | | 324/754.23 |
| 7,642,792 B2* | 1/2010 | Jager | .................. | G01R 31/2886 |
| | | | | 324/756.03 |
| 7,964,839 B1* | 6/2011 | Langley | .................... | G01J 1/02 |
| | | | | 250/214 R |
| 8,531,202 B2 | 9/2013 | Mok et al. | | |
| 2008/0049223 A1 | 2/2008 | Iyoki et al. | | |
| 2014/0091827 A1 | 4/2014 | Hung | | |

FOREIGN PATENT DOCUMENTS

| | | | |
|---|---|---|---|
| TW | 201500750 A | 1/2015 | |
| WO | 2005003737 A1 | 1/2005 | |

\* cited by examiner

WAFER PROBE CARD INTEGRATED WITH A LIGHT SOURCE FACING A DEVICE UNDER TEST SIDE AND METHOD OF MANUFACTURING

TECHNICAL FIELD

The present disclosure relates to a wafer probe card integrated with a light source facing a device under test (DUT) side, and enabling methodology. The present disclosure is applicable to an electrical wafer prober.

BACKGROUND

Semiconductor device fabrication requires monitoring the quality and stability of the semiconductor manufacturing processes and testing integrated circuit device electrical parameters to detect defective semiconductor dies before packaging. An automated parameter tester including a wafer prober is used to test the integrated circuits on a wafer. The wafer prober uses pattern recognition to align exactly onto the probe pads of the under test structures for electrical testing (ET) a set of microscopic contacts or probes. A probe card is held in place whilst the wafer (vacuum-mounted on a wafer chuck) is moved into electrical contact in a fast and reliable way. In particular, the probe card is electrically connected to a parameter tester of the wafer prober to provide an electrical path between the tester and a DUT on the wafer, thereby permitting the testing and validation of the DUT on the wafer. The parameter tester has high-accuracy and fast measurement equipment and power source units that measure voltage differences and currents. After the DUT, for example, a die or an array of dice, on the wafer, has been electrically tested, the wafer prober moves the wafer to test the next DUT. Such in-line parametric testing during wafer fabrication verifies device performance early in the fabrication cycle (near front-end of line) to monitor the process.

Process Capability Indices (PCI), such as process capability index/ratio (Cpk), are used to assess a process ability to achieve required specifications, such as consistently providing a very high variation of threshold voltage of MOS transistors. However, the wafers that deliver poor e-test parameters, such as process capability index/ratio (Cpk) of 1.19, become wafer scrap. Cpk of 1.19 is lower than consumer products Cpk specification of 1.33, and automotive products Cpk specification of 1.66, and much lower than the market demand for Cpk of 2 or higher.

A need, therefore, exists for a wafer prober with an improved Cpk. A need also exists for a method of manufacturing such wafer prober, and a method of using the wafer prober.

SUMMARY

An aspect of the present disclosure is a wafer probe card integrated with a light source facing a DUT side. The wafer probe card can be installed in a wafer prober, enabling control of the light source and intensity during testing.

Another aspect of the present disclosure is a wafer probe card integrated with a programmable light source in a wafer prober, wherein the light source selectively directly shines the light on DUT during e-test.

Another aspect of the present disclosure is a wafer tester including a light source being integrated onto a probe card and facing a DUT side. The wafer tester provides a Cpk of 2 or higher.

Another aspect of the present disclosure is a method of integrating a light source onto a wafer probe card facing a DUT side.

A further aspect of the present disclosure is a method including: mounting and electronically connecting a wafer probe card integrated with a light source to a wafer tester, with the light source facing a DUT side.

Additional aspects and technical effects of the present disclosure will set forth in the description and become readily apparent to those skilled in the art from the following detailed description, wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of wafer probers. The problems are solved, inter alia, by integrating a light source into a probe card that project light on a DUT. Methodology in accordance with embodiments of the present disclosure includes forming or connecting a light source onto a wafer probe card facing a DUT.

Although various embodiments are described with respect to cantilever-type probe cards, it is contemplated that the approach described herein may be used with other types of probe cards with a cavity to mount the light source.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
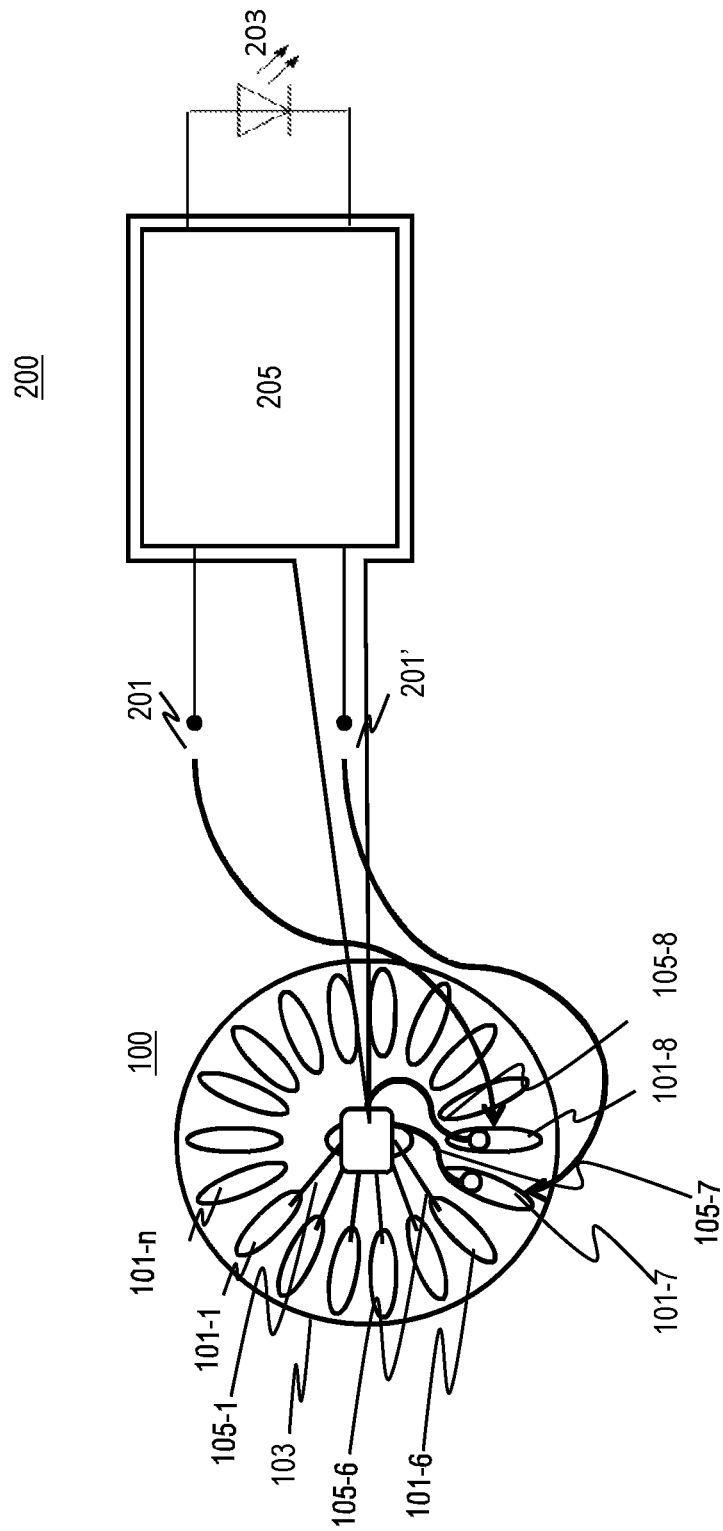
FIG. 1 schematically illustrates a top view of a wafer probe card and the relevant circuitry, in accordance with an exemplary embodiment.

FIG. 1 schematically illustrates a top view of a wafer probe card and the relevant circuitry, in accordance with an exemplary embodiment. FIG. 1 shows a top view of a layout of a probe card 100 with automated test equipment (ATE) connectors 101-1 to 101-n that are microscopic and arranged around the periphery of a printed circuit board (PCB) 103. In this example, ATE connectors 101-1 to 101-6 are wired by wires 105-1 to 105-6 to a wafer prober for DUT analysis, while redundant ATE connectors such as 101-7 to 101-8 are wired by wires 105-7 and 105-8 to contact points 201 and 201' of a light source 200. The wiring of the ATE connectors 101-1 to 101-n varies depending on a target wafer, since the ATE connectors must be effectively electrically connected to the universal pattern of a given tester and translate the signals to electrical pads on the target wafer. For example, DRAM and FLASH memory devices typically have aluminum pads at 40-90 micrometer (μm) per side. Other DUTs may have flat pads or raised bumps/pillars made of copper, copper alloys, or solders made of lead-tin, tin-silver, etc.

Light source 200 is positioned in the proximity of or at a center of probe card 100 without interfering with electrical probing. Light source 200 includes a light 203 and a light control circuitry 205 integrated on PCB 103. Light 203 may be an LED light applied with about 4.5V to generate a light with a wavelength range from about 400 nanometer (nm) to about 700 nm and an intensity range of about 5,000 millicandelas (mcd) to about 50,000 mcd.

Figure 2:
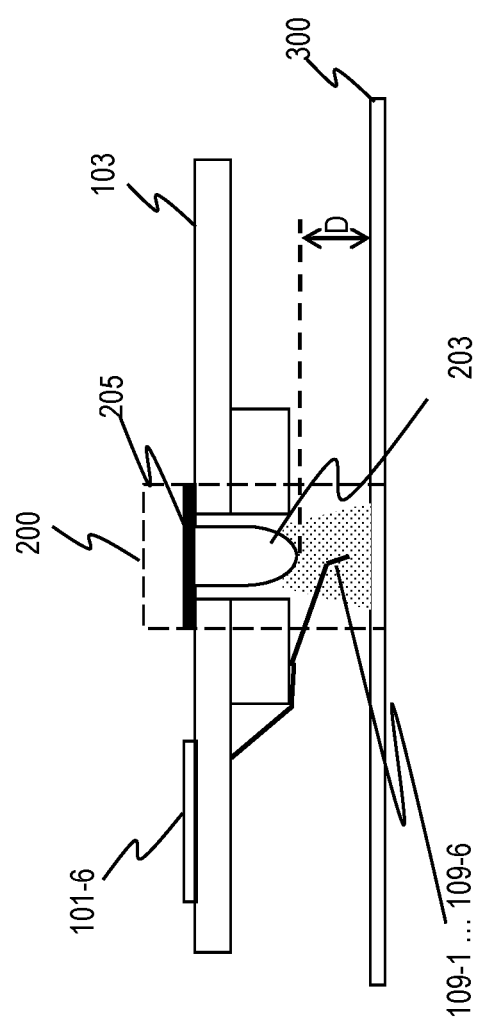
FIG. 2 schematically illustrates a cross-sectional view of the wafer probe card, in accordance with an exemplary embodiment.

FIG. 2 schematically illustrates a cross-sectional view of probe card 100 and light source 200, in accordance with an exemplary embodiment. Probe card 100 includes probe pins 109-1 to 109-6 on PCB 103 that is electrically connected to respective ATE connectors 101-1 to 101-6. The wafer prober includes a probe card analyzer (not shown for illustrative convenience) that measures electrical planarity of probe pins 109-1 to 109-6, while light 203 is positioned above a wafer 300 with a distance D that is about 1 millimeter (mm) to about 5 mm to directly project light covering a DUT.

In one embodiment, a force-current measurement involves forcing 1 uA current in a p-n junction of the DUT to reach a drain current (Id) of −0.1 μA and sensing drain voltage (Vbd) in a mass-production inline measurement using the wafer prober. During testing, the wafer prober automatically applies an ET program that includes a conceptual testing sequence of ET biasing conditions as listed in Table 1.

TABLE 1

| ET Tile | ET Biasing Conditions | Measurement Output | LED Light |
| --- | --- | --- | --- |
| Tile xx01 | ET Condition xx01 | DUT1_Para_xx01~Res | Light is OFF |
| Tile xx01 | ET Condition xx02 | DUT2_Para_xx02~Res | Light is OFF |
| Tile xx01 | ET Condition xx03 | DUT2_Para_xx03~BV | Light is Enabled |
| Tile xx01 | ET Condition xx04 | DUT2_Para_xx04~BV | Light is Enabled |
| Tile xx01 | ET Condition xx05 | DUT3_HVT_xx04~Idlin | Light is OFF |
| Tile xx01 | ET Condition xx06 | DUT3_HVT_xx05~Idoff | Light is OFF |

TABLE 1-continued

| ET Tile | ET Biasing Conditions | Measurement Output | LED Light |
| --- | --- | --- | --- |
| Tile xx01 | ET Condition xx07 | DUT3_HVT_xx06~Vtlin | Light is OFF |
| Tile xx01 | ET Condition xx08 | DUT3_HVT_xx07~Idsat | Light is OFF |
| Tile xx02 | ET Condition xx09 | DUTA_Para_xx08~Res | Light is OFF |
| Tile xx02 | ET Condition xx10 | DUTB_Para_xx09~Res | Light is OFF |
| . . . | | | |

The wafer prober controls a light circuitry 205 of light source 200 that is integrated in PCB 103 according to the ET bias conditions, to turn on or off light 203 as needed. FIGS. 3A to 3D schematically illustrate functional performances of the wafer probe card, in accordance with an exemplary embodiment. When testing Tile xx01 (e.g., a die) of wafer 300 (not shown for illustrative convenience) using ET conditions xx01, xx02, xx04 to xx07 to test at 15 sites with light 203 OFF, Vbd of a DUT oscillatory fluctuates between about 0V to about 20V while Id of DUT sweeps from −1 pA to −1 μA in a force-current measurement as shown in FIG. 3A during the force-current measurement.

Figure 3B:
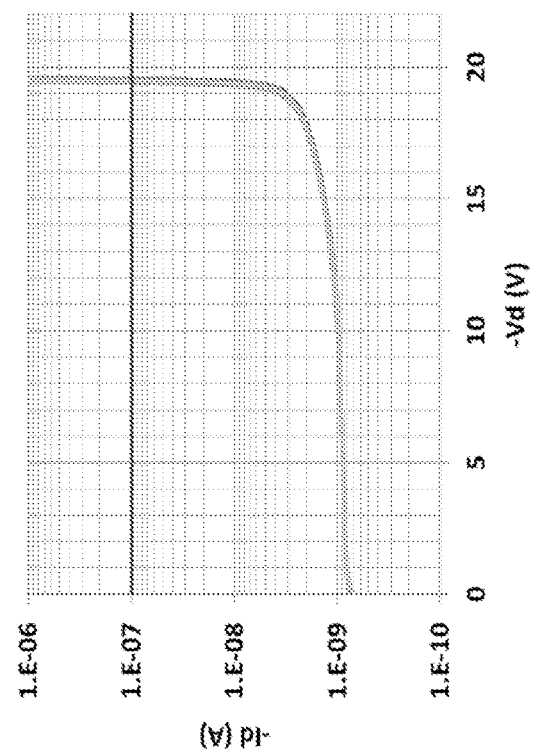
FIGS. 3A to 3D schematically illustrate functional performances of the wafer probe card, in accordance with an exemplary embodiment.

When testing Tile xx01 of wafer 300 using ET conditions xx03 to test the 15 sites with light 203 ON, Vbd averages about 19.5V while Id sweeps from about −10 pA to about −1 μA in the force-current measurement as shown in FIG. 3B. For example, such ET conditions xx03 include bias conditions for DUT as Force1=−1E-07, Compl1=25, Pins_smu1="7", Ground_pins="11 1 12 2", and bias conditions for light 203 as Force2=4.5, Coml2=1.5E-02, Pins_smu2="23", Pins_smu3="24". As another example, the conditions xx04 include bias conditions for DUT as Force1=1.0E-07, Compl1=25, Pins_smu1="22 2", Ground_pins="11 1 12", and bias conditions for light 203 as Force2=4.5, Coml2=1.5E-02, Pins_smu2="23", Pins_smu3="24".

Figure 3D:
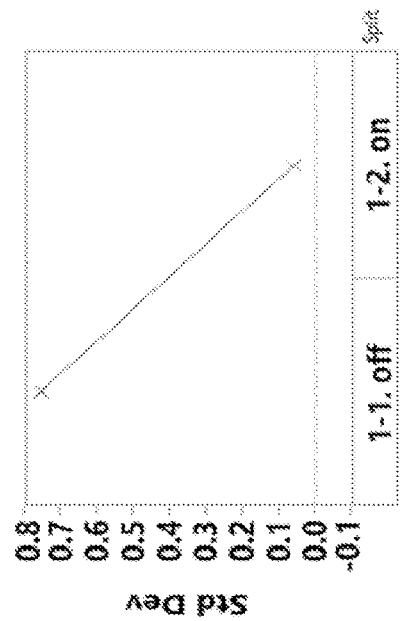
Figure 3A:
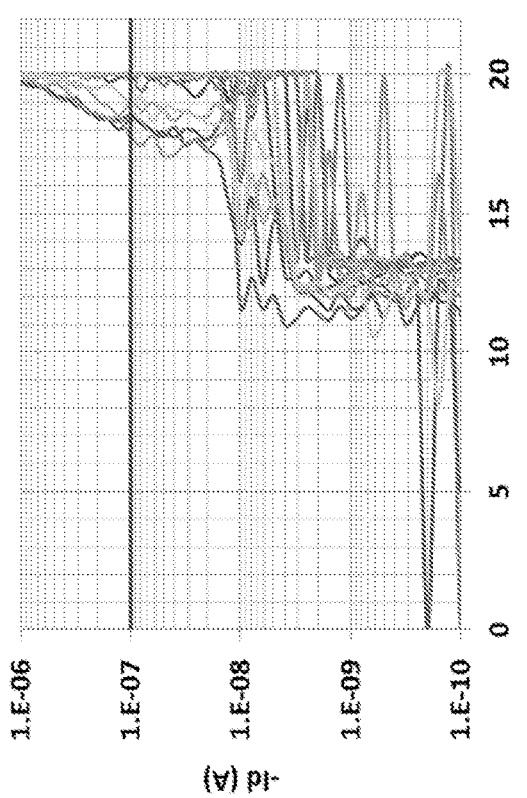
Figure 3C:
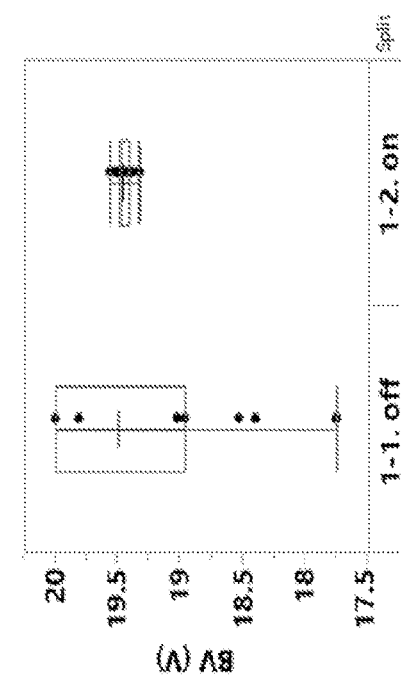

As further illustrated in FIGS. 3C to 3D, when light 203 is on, electrons are more available due to optical excitation of carriers, which makes impact ionization less random and the measurement more accurate and stable (0.08× of Vbd sigma). In short, turning on light 203 suppresses the fluctuation of Vbd. The probe card 100 with light source 200 successfully passed a high voltage isolation breakdown test. In addition to the breakdown voltage as discussed, the light source can be enabled to assist testing of other inline discrete transistor structure to measure leakage current, threshold voltage, effective channel length, etc.

"Light Enabled" measurements can be applied to test measurements performed using an ET parametric tester. In other embodiments, the probe card with a light source can also be applied to test: (1) various line widths by measuring critical dimensions; (2) a box in a box by measuring critical dimensions and overlay registration; (3) a serpentine structure over oxide steps by measuring continuity and bridging; (4) a resistivity structure by measuring film thickness; (5) a capacitor array structure by measuring insulator materials and oxide integrity; or (6) a contact or via string by measuring contact resistance and connection.

Beside in-line parametric testing during wafer fabrication, the probe card with a light source can be further applied to assist other wafer level electrical testing, such as wafer sort testing, and IC-design verification during pre-production to debug and verify new chip design and ensure the wafer meets specifications. The wafer sort testing verifies each die meets product specifications (e.g., DC testing, output checking, function testing, etc.), non-passing dice are marked with a small ink dot located in the middle of each dice or on the wafer map that store the information of passing or non-passing dice. When a wafer has too many failed dice thus fails the electrical test, it is moved from the manufacturing process for separate testing to ensure that it is defective.

In addition, the probe card with a light source can be applied to other testing process at the package-chip level, such as the burn-in reliability testing process, the final test (after packaging), or the quality control testing (after branding/marking packaged units), when a probe card with cavity that can mount the light source is deployed.

The embodiments of the present disclosure are capable of achieving several technical effects, such as suppressing ET fluctuation and spread signatures and improves Cpk by a novel ET probe card equipped with a programmable light source, which selectively generates light shining on the DUT during measurement. The embodiments achieve more stable E-test results with lower standard deviation and thereby improving Cp and Cpk. The light-ON measurement gives significant improvement on Sigma (0.08×) and thereby better Cpk (>2) for the mass-production inline measurement. Better Cpk produces smaller amount of ET failure wafer scrap thus saving cost. This increases the accuracy of the characterization of the probe pins and the overall probe card interaction with the wafer prober. In addition, it is compatible with a fully-automated mass-production inline measurement.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A wafer probe card integrated with a light source facing a device under test (DUT) side,
    wherein the light source comprises light control circuitry integrated in a printed circuit board of the wafer probe card,
    wherein the light control circuitry controls the light source and intensity,
    wherein the printed circuit board of the wafer probe card comprises probe pins extending from the printed circuit board to underneath the light source, and
    wherein the probe pins are electrically connected to respective automated test equipment connectors arranged around a periphery of the printed circuit board.

2. The wafer probe card according to claim 1, wherein the light source is positioned approximately at a center of the wafer probe card.

3. The wafer probe card according to claim 1, wherein the light source is positioned above the DUT at a distance range of 1 millimeter (mm) to 5 mm.

4. The wafer probe card according to claim 1, wherein the light source generates a light of a wavelength range from 400 nanometer (nm) to 700 nm.

5. The wafer probe card according to claim 4, wherein the light has an intensity range of 5,000 millicandelas (mcd) to 50,000 mcd.

6. A wafer tester comprising a light source integrated onto a probe card and facing a device under test (DUT) side,
    wherein the light source comprises light control circuitry integrated in a printed circuit board of the probe card,
    wherein the light control circuitry controls the light source and intensity,
    wherein the printed circuit board of the probe card comprises probe pins extending from the printed circuit board to underneath the light source, and
    wherein the probe pins are electrically connected to respective automated test equipment connectors arranged around a periphery of the printed circuit board.

7. The wafer tester according to claim 6, wherein the light source is positioned approximately at a center of the probe card.

8. The wafer tester according to claim 6, wherein the light source is positioned above the DUT at a distance range of 1 millimeter (mm) to 5 mm.

9. The wafer tester according to claim 6, wherein the light source generates a light of a wavelength range from 400 nanometer (nm) to 700 nm.

10. The wafer tester according to claim 9, wherein the light has an intensity range of 5,000 millicandelas (mcd) to 50,000 mcd.

11. A method comprising:
    mounting and electronically connecting a wafer probe card integrated with a light source to a wafer tester, with the light source facing a device under test (DUT) side,
    wherein the light source comprises light control circuitry integrated in a printed circuit board of the wafer probe card,
    wherein the light control circuitry controls the light source and intensity,
    wherein the printed circuit board of the wafer probe card comprises at least one probe pins extending from the printed circuit board to underneath the light source, and
    wherein the probe pins are electrically connected to respective automated test equipment connectors arranged around a periphery of the printed circuit board.

12. The method according to claim 11, further comprising:
    turning on the light source when the DUT is being tested, wherein the light source is turned on via the light control circuitry integrally formed in the printed circuit board of the wafer probe card.

13. The method according to claim 12, wherein the DUT is under IC-design verification during pre-production, in-line parametric testing during wafer fabrication, or wafer sort testing.

14. The method according to claim 12, wherein the DUT is an inline discrete transistor structure, a serpentine structure, a resistivity structure, a capacitor array structure, or a contact string.

15. The method according to claim 12, wherein the light source is positioned approximately at a center of the wafer probe card.

16. The method according to claim 12, wherein the light source is positioned above the DUT at a distance range of 1 millimeter (mm) to 5 mm, when testing the DUT.

17. The method according to claim 16, wherein the light source generates a light of a wavelength range from 400 nanometer (nm) to 700 nm.

18. The method according to claim 16, wherein the light has an intensity range of 5,000 millicandelas (mcd) to 50,000 mcd.

\* \* \* \* \*